United States Patent
Repko et al.

(10) Patent No.: US 7,421,365 B2
(45) Date of Patent: Sep. 2, 2008

(54) AUTOMATED CIRCUIT BOARD TEST ACTUATOR SYSTEM

(75) Inventors: Thomas A. Repko, Dallas, OR (US); Frank W. Joyce, Portland, OR (US); Teik Sean Toh, Malaysia (MY); Douglas P. Kreager, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 64 days.

(21) Appl. No.: 11/313,332

(22) Filed: Dec. 21, 2005

(65) Prior Publication Data

US 2006/0100813 A1    May 11, 2006

Related U.S. Application Data

(60) Division of application No. 10/393,972, filed on Mar. 21, 2003, which is a continuation-in-part of application No. 10/261,055, filed on Sep. 30, 2002, now Pat. No. 7,154,257.

(51) Int. Cl.
*G01R 31/00* (2006.01)
(52) U.S. Cl. ............... 702/120; 324/763; 324/73.1; 324/158.1; 439/51; 439/131; 439/245; 714/30; 714/733; 714/734
(58) Field of Classification Search ............... 702/117, 702/118, 120, 158; 324/158.1, 755, 763, 324/73.1; 714/30, 733, 734; 439/51, 245, 439/131
See application file for complete search history.

(56) References Cited

U.S. PATENT DOCUMENTS

| | | |
|---|---|---|
| 3,924,109 A | 12/1975 | Jhu et al. |
| 4,513,498 A | 4/1985 | Kent |
| 4,517,512 A | 5/1985 | Petrich et al. |
| 4,550,406 A | 10/1985 | Neal |
| 4,574,235 A | 3/1986 | Kelly et al. |

(Continued)

FOREIGN PATENT DOCUMENTS

DE         3405568        8/1985

(Continued)

OTHER PUBLICATIONS

U.S. Appl. No. 10/261,055, filed on Sep. 30, 2002, Le et al., "Universal Automated Circuit Board Tester," Office Action mailed on Aug. 12, 2004. (now US 7,154,257).

(Continued)

*Primary Examiner*—Carol S Tsai
(74) *Attorney, Agent, or Firm*—Blakely, Sokoloff, Taylor & Zafman LLP

(57) ABSTRACT

An apparatus for automatically inserting connectors and coupling test probes to circuit boards, such as computer system boards and the like. The apparatus enables connectors to be automatically inserted into mating connectors on a circuit board device under test (DUT). Connectors may be automatically inserted along 1-4 axes. The apparatus includes replaceable probe/connector plates that are DUT-type specific, as well as DUT-type specific side access units. The apparatus may also be used for inserting memory devices and microprocessors, and further enables peripheral devices to be operatively coupled to expansion bus connectors on the DUT. In one embodiment, a single actuator is employed to actuate up to four insertion axes simultaneously.

16 Claims, 15 Drawing Sheets

U.S. PATENT DOCUMENTS

| | | | |
|---|---|---|---|
| 4,931,723 | A | 6/1990 | Jeffrey et al. |
| 4,994,732 | A | 2/1991 | Jeffrey et al. |
| 5,124,636 | A | 6/1992 | Pincus et al. |
| 5,541,504 | A | 7/1996 | Kubo et al. |
| 5,609,489 | A | 3/1997 | Bickford et al. |
| 5,751,151 | A | 5/1998 | Levy et al. |
| 6,084,774 | A * | 7/2000 | Talbot et al. ............... 361/704 |
| 6,087,839 | A | 7/2000 | Choi |
| 6,097,201 | A * | 8/2000 | Slocum ..................... 324/760 |
| 6,097,202 | A | 8/2000 | Takahashi |
| 6,100,706 | A | 8/2000 | Hamilton et al. |
| 6,118,288 | A | 9/2000 | Kang |
| 6,163,866 | A | 12/2000 | Ansari |
| 6,259,265 | B1 | 7/2001 | Han et al. |
| 6,344,736 | B1 | 2/2002 | Kerrigan et al. |
| 6,422,886 | B1 | 7/2002 | Macbeth et al. |
| 6,453,435 | B1 | 9/2002 | Limon, Jr. et al. |
| 6,459,805 | B1 | 10/2002 | Reynolds et al. |
| 6,462,570 | B1 | 10/2002 | Price et al. |
| 6,524,123 | B2 | 2/2003 | Kedrowski et al. |
| 6,532,558 | B1 | 3/2003 | Allen et al. |
| 6,597,189 | B1 | 7/2003 | Grilletto |
| 6,630,832 | B1 | 10/2003 | Harzanu et al. |
| 6,744,268 | B2 | 6/2004 | Hollman |
| 6,751,856 | B2 | 6/2004 | Kedrowski et al. |
| 6,754,763 | B2 | 6/2004 | Lin |
| 6,757,715 | B1 | 6/2004 | Philyaw |
| 2002/0055285 | A1* | 5/2002 | Perino et al. ................. 439/70 |
| 2002/0098728 | A1 | 7/2002 | Kedrowski et al. |
| 2003/0092300 | A1 | 5/2003 | Kedrowski et al. |
| 2004/0043653 | A1 | 3/2004 | Feldman |
| 2004/0064273 | A1 | 4/2004 | Le et al. |
| 2004/0066207 | A1 | 4/2004 | Bottoms et al. |
| 2004/0263188 | A1 | 12/2004 | Hwang |

FOREIGN PATENT DOCUMENTS

| | | |
|---|---|---|
| DE | 4100014 A1 | 7/1992 |
| EP | 0293304 | 11/1988 |
| FR | 2224972 | 10/1974 |
| WO | WO 98/25152 | 6/1998 |
| WO | PCT/US2004/005938 | 9/2004 |

OTHER PUBLICATIONS

U.S. Appl. No. 10/261,055, filed on Sep. 30, 2002, Le et al., "Universal Automated Circuit Board Tester," Office Action mailed on Feb. 15, 2005. (now US 7,154,257).

U.S. Appl. No. 10/261,055, filed on Sep. 30, 2002, Le et al., "Universal Automated Circuit Board Tester," Office Action mailed on Jul. 22, 2005. (now US 7,154,257).

U.S. Appl. No. 10/261,055, filed on Sep. 30, 2002, Le et al., "Universal Automated Circuit Board Tester," Office Action mailed on Nov. 1, 2005. (now US 7,154,257).

U.S. Appl. No. 10/261,055, filed on Sep. 30, 2002, Le et al., "Universal Automated Circuit Board Tester," Office Action mailed on May 16, 2006. (now US 7,154,257).

U.S. Appl. No. 10/821,570, filed on Apr. 9, 2004, Le et al., "Universal Automated Circuit Board Tester," Office Action mailed on Sep. 10, 2004. (now US 7,110,905).

U.S. Appl. No. 10/821,570, filed on Apr. 9, 2004, Le et al., "Universal Automated Circuit Board Tester," Office Action mailed on Apr. 21, 2005. (now US 7,110,905).

U.S. Appl. No. 10/821,570, filed on Apr. 9, 2004, Le et al., "Universal Automated Circuit Board Tester," Office Action mailed on Dec. 9, 2005. (now US 7,110,905).

U.S. Appl. No. 10/393,972, filed on Mar. 21, 2003, Repko et al., "Automated Circuit Board Test Actuator System," Office Action mailed on Nov. 10, 2004. (now US 6,999,888).

U.S. Appl. No. 10/393,972, filed on Mar. 21, 2003, Repko et al., "Automated Circuit Board Test Actuator System," Office Action mailed on Mar. 31, 2005. (now US 6,999,888).

U.S. Appl. No. 11/314,900, filed on Dec. 21, 2005, Repko et al., "Automated Circuit Board Test Actuator System," Office Action mailed on Feb. 1, 2007.

U.S. Appl. No. 10/261,055, Filed on Sep. 30, 2002, Le et al., "Universal Automated Circuit Board Tester," Office Action mailed on Mar. 3, 2004. (now 7,154,257).

U.S. Appl. No. 10/261,055, Filed Sep. 30, 2002, Le et al., "Universal Automated Circuit Board Tester," Office Action mailed on Oct. 3, 2005. (now US 7,154,257).

U.S. Appl. No. 10/393,972, Filed on Mar. 21, 2003, Repko et al., "Automated Circuit Board Test Actuator System," Office Action mailed on Aug. 30, 2004. (now US 6,999,888).

U.S. Appl. No. 11/313,332, Filed Dec. 21, 2005, Repko et al., "Automated Circuit Board Test Actuator System," Office Action mailed on Apr. 26, 2007.

* cited by examiner

AUTOMATED CIRCUIT BOARD TEST ACTUATOR SYSTEM

CROSS-REFERENCE TO RELATED APPLICATIONS

The present application is a divisional of U.S. application Ser. No. 10/393,972, entitled "UNIVERSAL AUTOMATED CIRCUIT BOARD TESTER," filed Mar. 21, 2003, which is a continuation-in-part of U.S. application Ser. No. 10/261,055, entitled "UNIVERSAL AUTOMATED CIRCUIT BOARD TESTER," filed Sep. 30, 2002 now U.S. Pat. No. 7,154,257, the benefit of the priority date of which is claimed under U.S.C. 35 § 120.

FIELD OF THE INVENTION

The field of invention relates generally to testing circuit boards and, more specifically but not exclusively relates to an apparatus and method for automatically testing circuit boards used in computer systems.

BACKGROUND INFORMATION

It is a common practice to perform testing of circuit boards, such as computer system boards (e.g., motherboards and the like) prior to their sale or use in a computer system product. For example, as computer system boards have evolved, an ever-increasing level of functionality has been built into the boards, such as integrated video subsystems, audio systems, network interfaces, modem circuitry, and the like. Testing to verify the integrity of such functionality is often performed during quality control operations, either on an individual board basis, or using a random sampling scheme.

Generally, computer system boards are tested in the following manner. The board is mounted or otherwise coupled to a test plate or the like, and a plurality of input connectors are manually mated with corresponding system board connectors to provide input power signals to the system board and to coupled input/output (I/O) ports and the like to electronic test equipment that is used to test the performance of the system board via a variety of test operations. Additional manual operations typically include insertion of memory and/or microprocessors. This is a very laborious process, and is also very time-consuming. As a result, the test throughput is low, and test costs are excessive.

In addition, when different types of computer system boards are to be tested, the test environment will often require a uniquely-configured test station for each type of board. For example, different system board types may require different power supply inputs, and/or may have different memory slot locations. Accordingly, the test station used to perform testing of such system boards must be configured to accommodate any unique characteristics of the system boards. This adds to the expense and complexity of a test environment. Furthermore, when the computer system board for a particular test station is phased-out of production, the test station is often scrapped, as it cannot be used to test other types of system boards.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified.

DETAILED DESCRIPTION OF PREFERRED EMBODIMENTS

Embodiments of apparatus and methods for automatically inserting connectors and coupling test probes to circuit boards in conjunction with performing automated testing of such circuit boards are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1A:
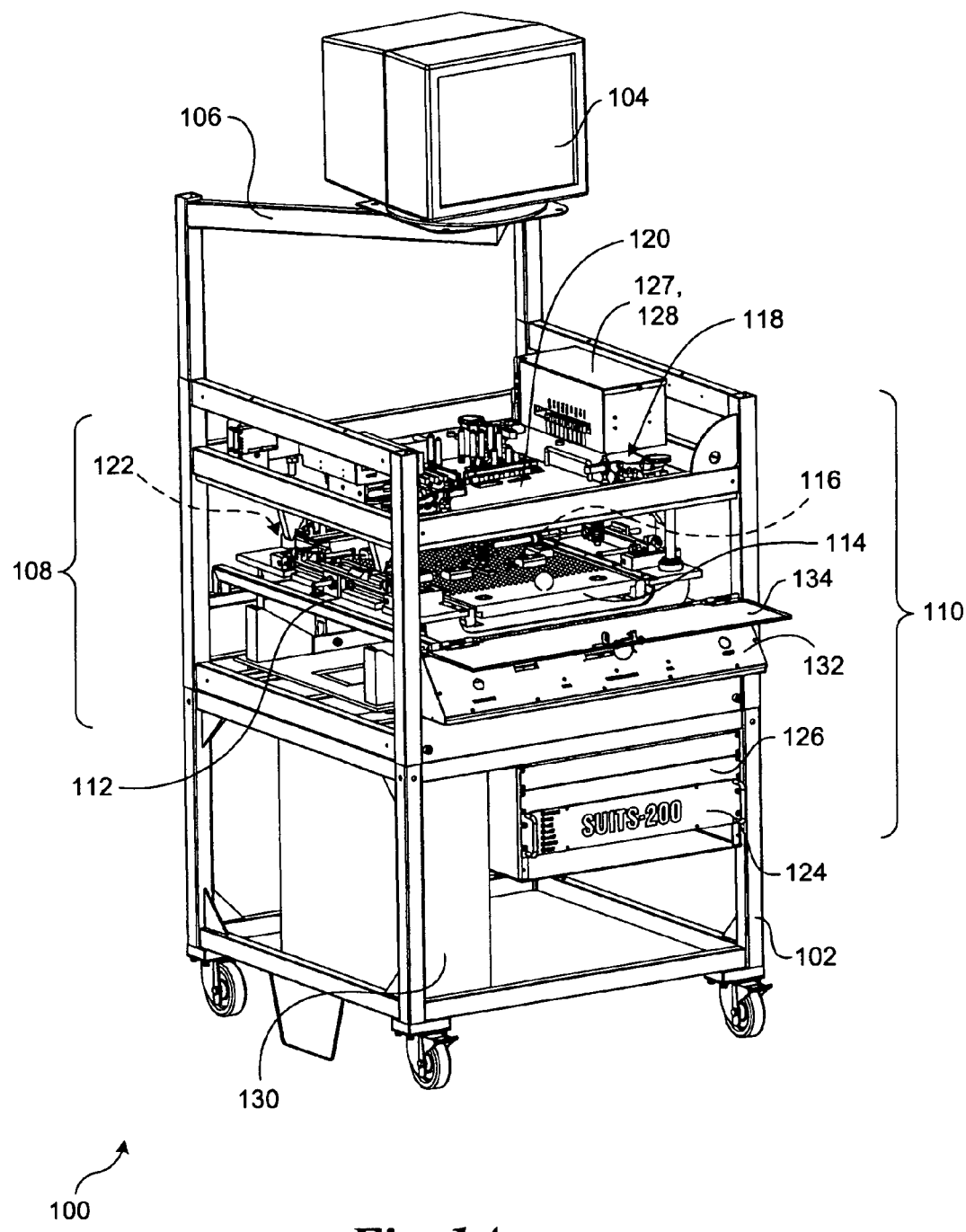
FIGS. 1A and 1B are isometric views of an automated universal circuit board tester in accordance with one embodiment of the invention.
Figure 1B:
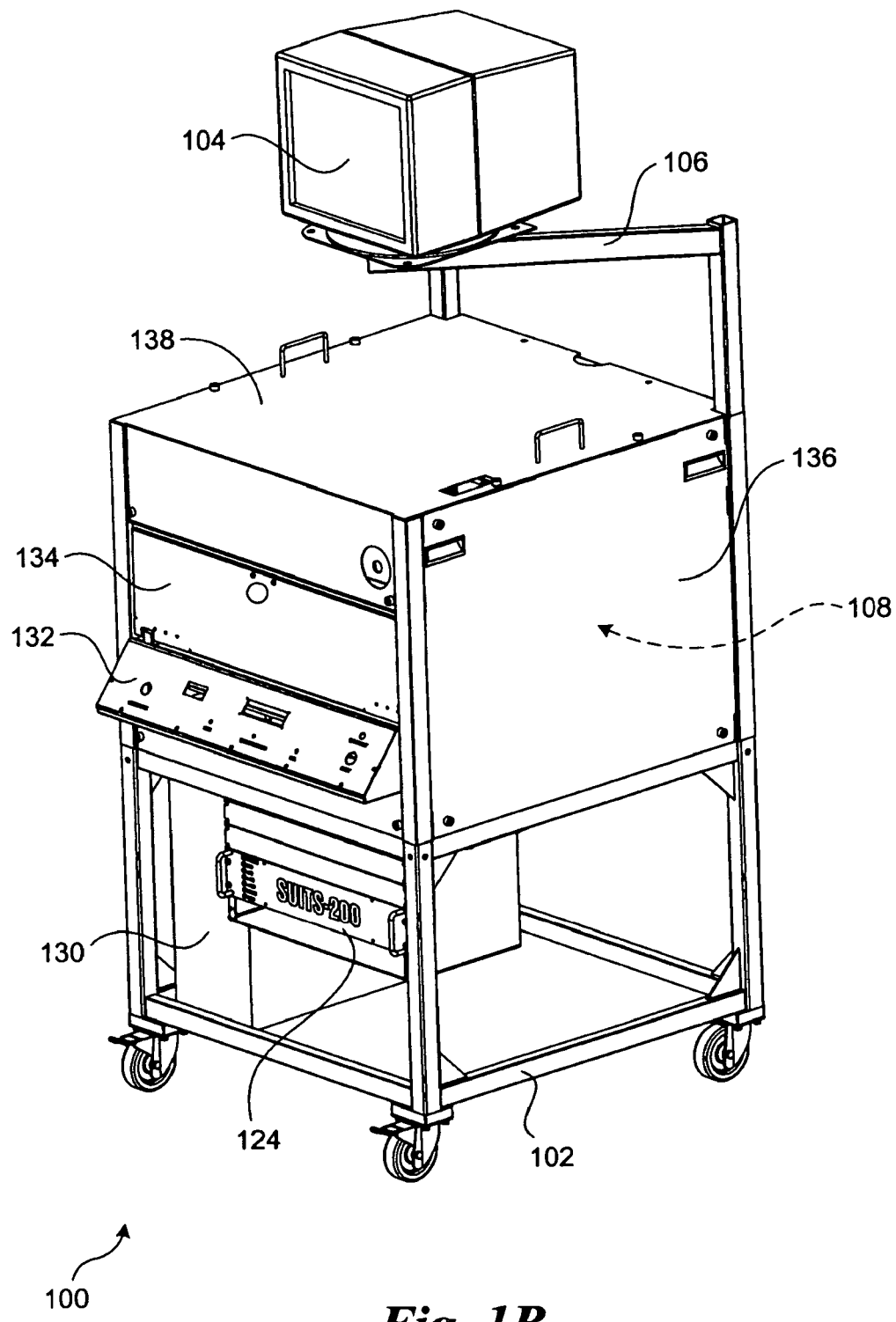

An overview of an embodiment of an automatic circuit board tester 100 corresponding to a Scalable Universal Integrated Test System (SUITS) in which various embodiments of the invention described herein may be employed is shown in FIGS. 1A and 1B. Automated circuit board tester 100 includes a frame 102 to which a monitor 104 is attached via a boom 106. An automated connector insertion/probe mechanism 108 is housed within the frame, along with test electronics 110. The automated connector insertion/probe mechanism employs a carrier assembly 112 including a carrier plate 114 to which a circuit board comprising a device under test (DUT) 116 (not shown) is coupled during testing. The mechanism further includes a universal cassette 118 to which a replaceable top probe/connector plate 120 is attached, and a replaceable side access unit (SAU) 122 that is used to connect to various I/O port connectors generally disposed at the rear of the DUT. Additional SAU's may also be employed for DUT's that include I/O ports on one or both sides of the DUT.

The test electronics for the SUITS tester include various circuit boards that are configured to support a universal test environment via a common (Universal Serial Bus (USB)) communication interface, whereby circuit boards having different configurations may be tested using a common (i.e., universal) tester. This is facilitated, in part, by a universal power supply (UPS) 124 that receives power from a power distribution unit (PDU) 126 and supplies power to DUT 116 and other test electronics components. The test electronics further include a digital video measurement unit (DVMU) 127 and combo board 128 used for audio, analog/digital video and USB 2.0 testing contained within a housing mounted to universal cassette 118.

In general, test operations are controlled by a host computer 130, disposed toward the bottom of the frame, which is linked in communication with the test electronics via USB and serial communication links. More specifically, the host computer is used to execute software comprising a universal host controller (UHC) that is used to control testing of the DUT. The system also includes a control panel 132 to enable user interaction, and provides an access door 134 to allow the DUT to be loaded and to prevent access to the DUT (and associated test electronics) during testing. Furthermore, the tester includes removable side and top panels 136 and 138 that are installed during testing operations so as to prevent access to the DUT and tester electronics, as shown in FIG. 1B. Further details of the tester electronics and software operations performed during DUT testing are described in the parent application identified above in the cross-reference to related application section.

Further details of automated connector insertion/probe mechanism 108 are shown in FIGS. 2A-C, and 3A-C. In one embodiment, a single linear actuator is employed to cause concurrent actuation about four orthogonal axes. In one embodiment the linear actuator comprises a pneumatic cylinder 200, which has a body coupled a carriage 202 and a rod operatively coupled to frame 102. The concurrent multi-axis actuation includes a vertical actuation that is used to vertically move the DUT so that it engages various connectors and probes disposed on the underside of top probe/connector plate 120. This is enabled, in part, by means of four vertical actuation guide ramps 204, which are mounted on carriage 202. Carriage 202 rolls on a plurality of wheels 206 mounted within a frame 208 that is mounted to frame members 210.

A vertical push plate 211 is provided to push carrier assembly 112 upward. Four brackets 212 are coupled to the underside of vertical push plate 211. A respective cam follower 213 is coupled towards the bottom of each of brackets 212 and is sized to fit within a corresponding slot 214 formed in vertical actuation guide ramps 204.

Carrier assembly 112 includes a carrier frame 216 to which a pair of linear bearings 218 are coupled. Likewise, a pair of similar linear bearings 219 are coupled to vertical push plate 211. Each of linear bearings 216 and 217 slidingly engage a mating vertically-disposed linear bearing shaft 220 that is operatively coupled at its respective upper and lower ends to frame 102.

A drawer slide 222 is coupled between carrier frame 216 and a carrier plate support 224 on which carrier plate 114 rests to enable the carrier plate to be pulled forward relative to the carrier frame, thereby enabling a DUT that has just completed testing to be removed and a new DUT to be installed on the carrier plate. A knob 226 is provided to further assist an operator in pulling and pushing carrier plate 114.

In addition to a vertical actuation axis, three horizontal actuation axes are also provided. These actuation axes correspond to respective side activation unit (SAU) actuators, which are used to actuate SAUs 122 (removed for clarity in FIGS. 2A-2C). Each SAU actuator comprises a SAU carriage 228 that is enabled to move linearly relative to carrier frame 216 by means of end linear bearing assemblies 230 and a center linear bearing assembly 232. Each SAU carriage further includes a pair of cam followers 234 that engage respective SAU actuation ramps 236 during SAU actuation.

Figure 2A:
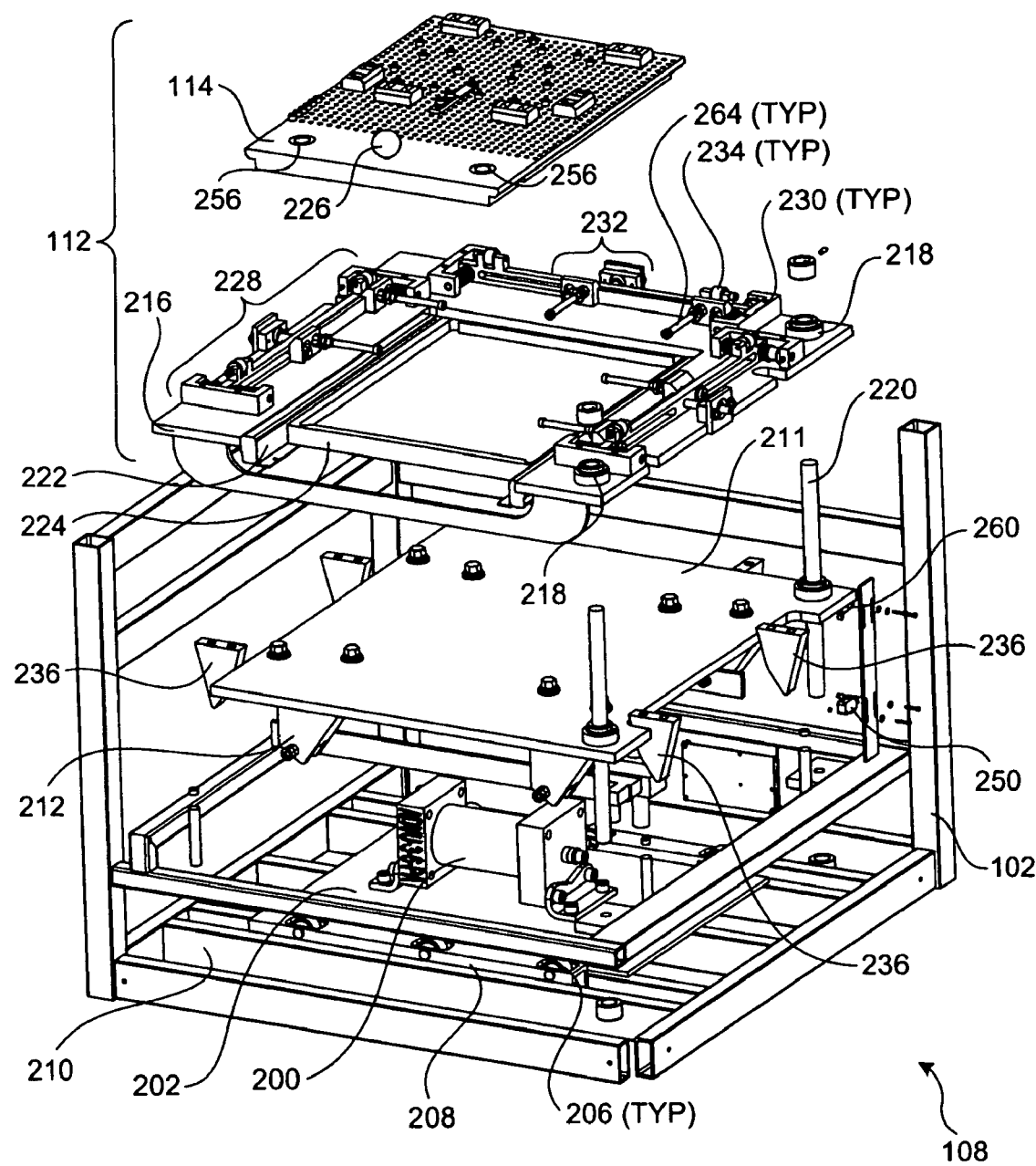
FIGS. 2A, 2B, and 2C respectively show exploded, frontal, and side isometric views of the automated probe/connector insertion mechanism employed an embodiment of the invention.
Figure 2B:
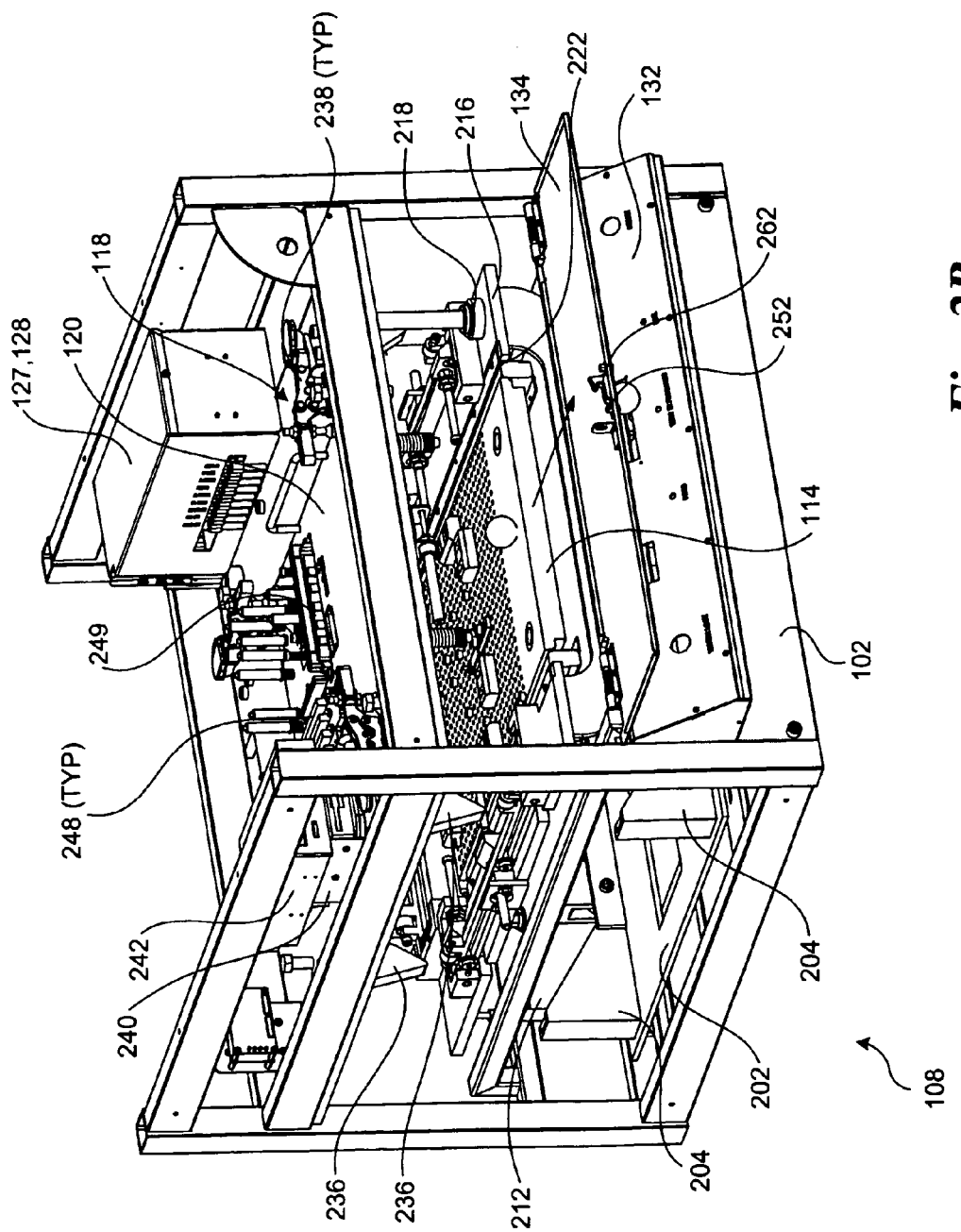
Figure 3A:
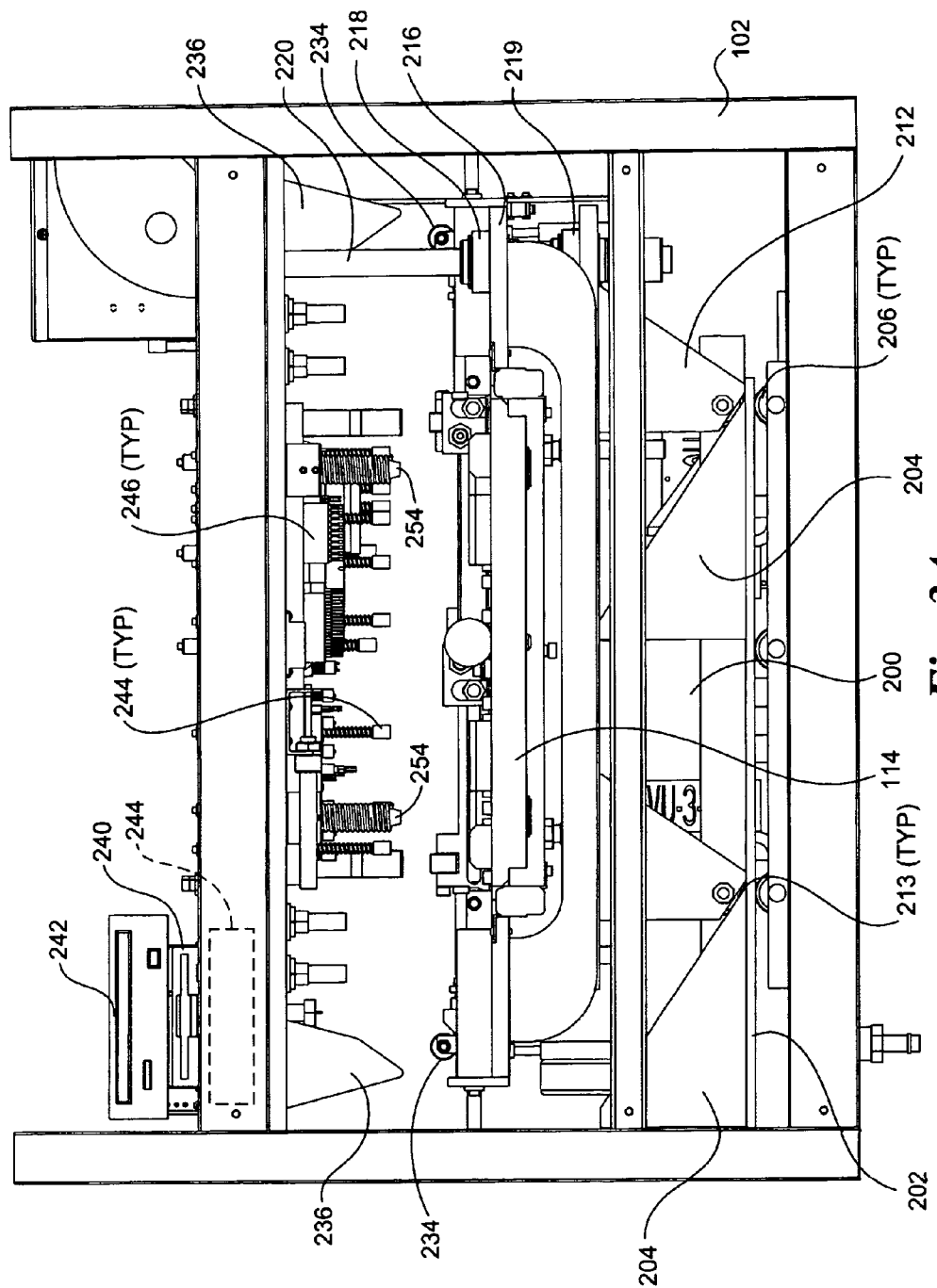
FIGS. 3A, 3B, and 3C respectively show fully disengaged, middle, and fully engaged actuation states corresponding to an actuation cycle of the automated probe/connector insertion mechanism.

Further details of universal cassette 118 and top probe/connector plate 120 are shown in FIGS. 2B and 3A. The combination of universal cassette 118 and top probe/connector plate 120 are designed to enabling testing of various DUT board types, wherein the functions provided by universal cassette 118 are "universal" to all board types, while top probe/connector plate 120 is configured for a certain board type or set of board types. Accordingly, mounting provisions are provided to enable top probe/connector plate 120 to be swapped out. These include a set of toggle clamps 238 and plate alignment means that are used to align the top probe/connector plate relative to the universal cassette.

Universal cassette includes various components that are used to simulate the DUT functioning within an actual work environment, such as within a computer. These include a floppy drive 240, a CD-ROM drive 242, and a hard disk drive (disposed beneath the floppy drive). Generally, the interfaces to each of these devices are provided via connectors coupled on the underside of top probe/connector plate 120. Optionally, such connectors may be disposed on the underside of the universal cassette when the DUT types share a common configuration for such connectors.

Typically, different board types will have different connector/component layout configurations. Accordingly, each top probe/connector plate 120 will be configured for a corresponding board type or set of types. This means that the various probes 244 and connectors 246 will be configured, both in orientation and type, so as to mate with corresponding target pads/traces/components and connectors for the DUT type. In addition to general connector types, such as power, and peripheral device (e.g., disk drives, IDE, etc.) connectors, one or both of the top probe/connector plate and universal cassette may employ peripheral (expansion) bus extenders 248, which enable various types of peripheral boards, such as video boards, sound boards, network interface cards (NICs), SCSI cards, special purpose cards, etc., to be operatively coupled to the DUT during testing operations.

Another aspect of the automated insertion capabilities of the system is the ability to automatically insert memory and/or microprocessors. For example, the top probe/connector plate may be configured to hold one or more DIMMs (dual inline memory modules) 249, which are inserted into corresponding DIMM connectors on the DUT. Additionally, if the DUT type employs a removable processor, such as a slot 1 processor, a corresponding processor may be mounted to the top probe/connector plate and inserted into a corresponding connector on the DUT.

Further details illustrating an actuator motion cycle are shown in FIGS. 2A-C and 3A-C. FIGS. 2A and 3A show an initial configuration corresponding to a fully-disengaged actuation condition. Under this condition, the pneumatic cylinder is fully retracted such that cam followers 213 are at the bottom of vertical actuation guides 204. While in this position a lower position switch 250 will be engaged, which will enable access door 134 to be opened, thereby enabling an operator to install or remove a DUT. After the access door has been shut, the actuator sequence may begin. The position of the access door is sensed by a door engagement sensor 252.

Figure 3B:
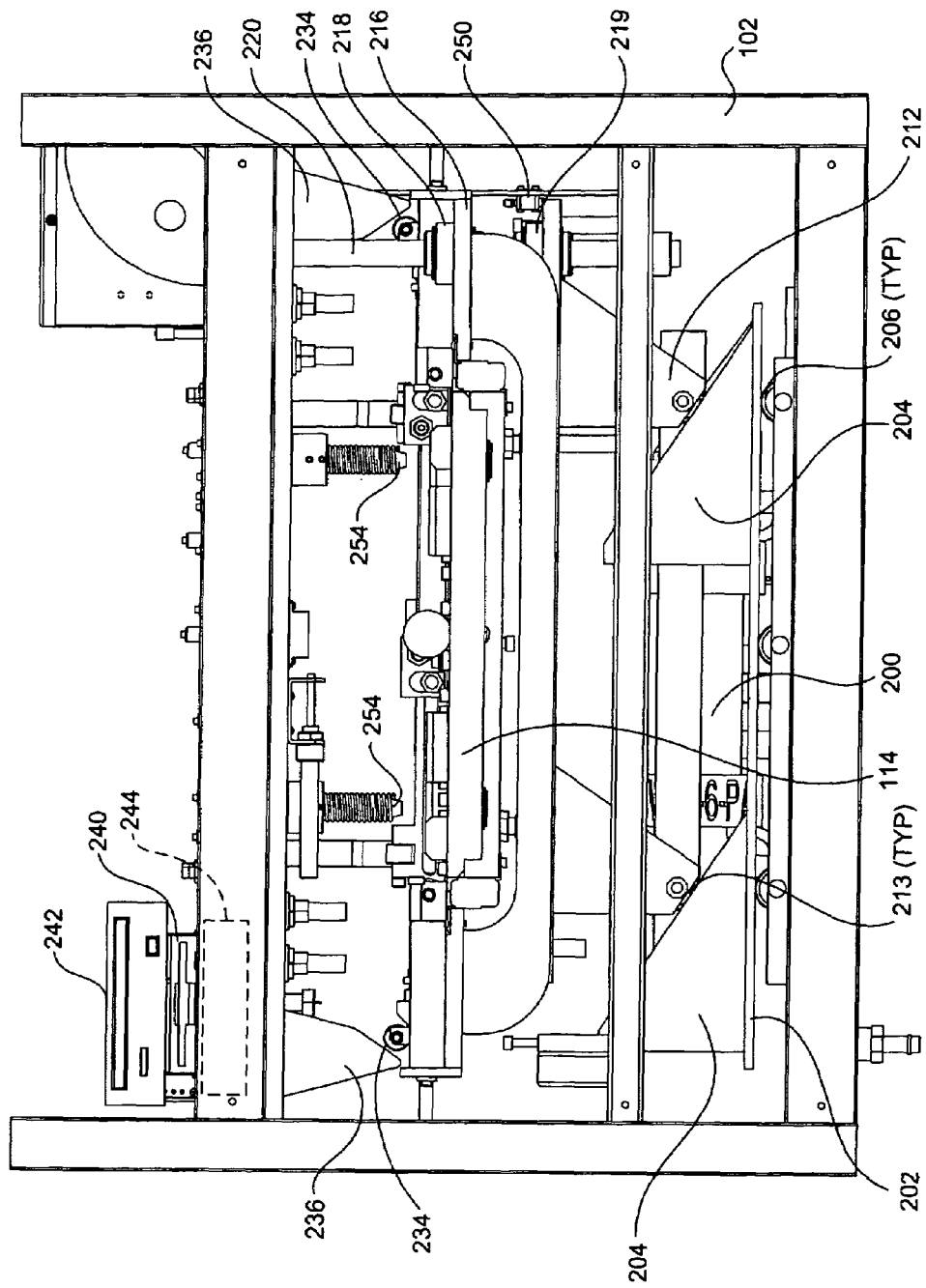

A mid actuation position is shown in FIGS. 2B and 3B. In this instance, a valve is positioned to enable air to flow into pneumatic cylinder 200, causing the cylinders rod to be extended. This cause carriage 202 to move toward the left, which pushes vertical push plate 211 upward by means of engagement of cam followers 213 with vertical actuation guide ramps 204. As is further shown, SAU cam followers 234 are about to engage SAU actuation ramps 236. Furthermore, carrier plate 114 is positioned such that it is just below a pair of alignment posts 254.

Figure 2C:
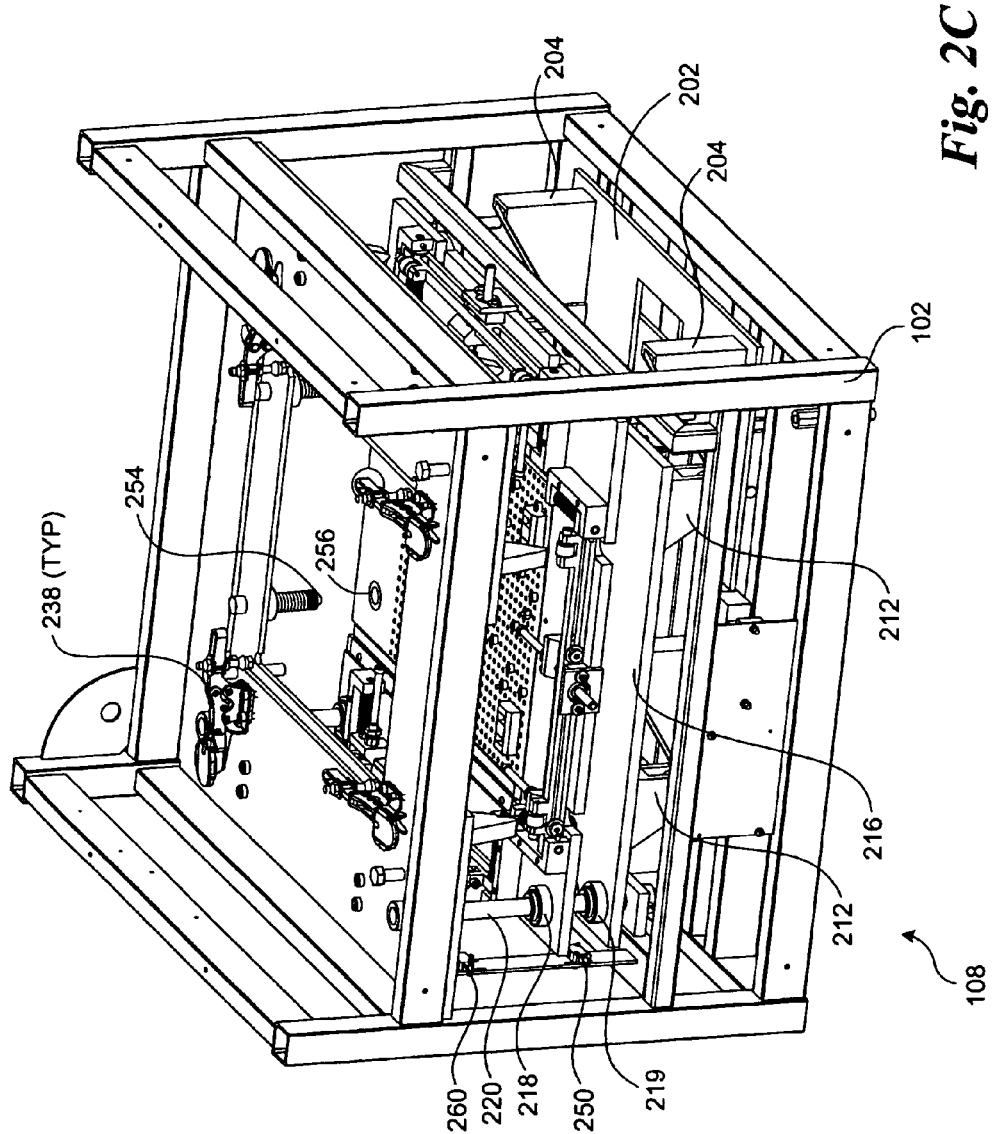
Figure 3C:
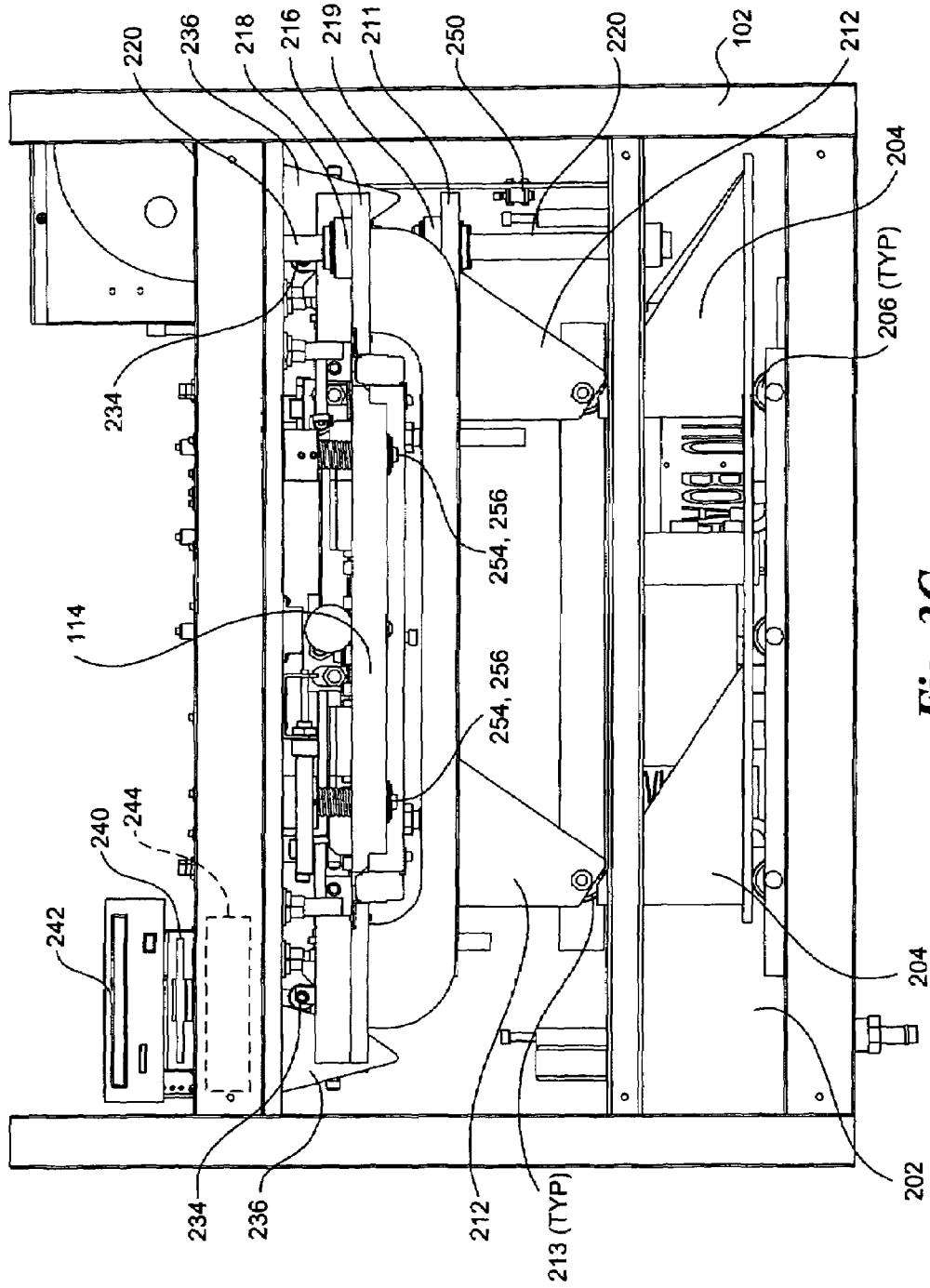

A fully-engaged position is shown in FIGS. 2C and 3C. As vertical push plate 211 is pushed upward, it engages carrier frame 216, which in turn supports carrier plate 114, pushing the carrier plate upward in turn. As the carrier plate moves upwards, a pair of bushings 256 disposed in the plate begin to engage alignment post 254. Since the carrier plate is "floating" on carrier plate frame 224, the carrier plate is enabled to self align to the alignment posts. As the carrier plate is lifted in proper alignment via the alignment posts, various connectors 246 are engaged with corresponding connectors on the DUT, as well as various probes engaging with target traces, pads, components etc. At the same time, memory DIMMs, a CPU, and peripheral expansion bus connectors are also coupled, dependent on the particular DUT type configuration. This completes the vertical part of the automated test probe/connector insertion. Once the carriage assembly is at the top of the actuation cycle, testing operations may begin. This condition is indicated by a fully-engaged (ACTUATOR_FULL_UP) position sensor 260.

In concurrence with the foregoing vertical actuation, horizontal actuation of the SAUs is performed. As the carriage assembly moves upward, SAU cam followers 234 engage SAU actuation ramps 236, causing SAU carriages 228 to be moved horizontally inward. As a result, the connectors on the SAU (shown in FIG. X) become engaged with corresponding connectors on the DUT. For example, a typical DUT may comprise an ATX-compatible motherboard, which includes a plurality of connectors having a predefined configuration that are mounted to the motherboard such that they can be horizontally accessed from opening in the case in which the motherboard is to be installed. These connectors typically include serial and parallel ports, as well as a keyboard port, a mouse port, and optional USB, game/audio ports, and network ports. Other types of ports may be provided as well.

Figure 4:
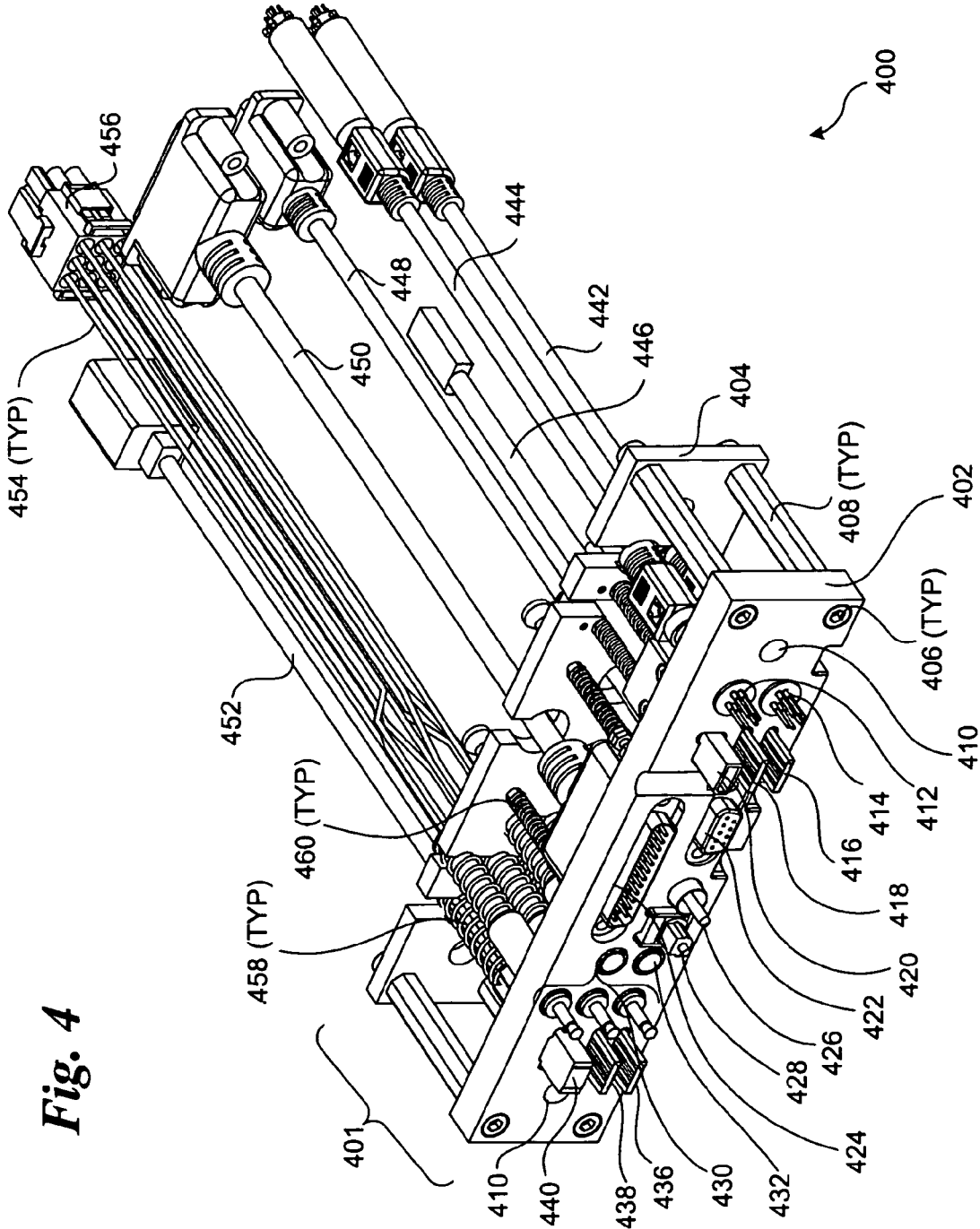
FIG. 4 is an isometric view of a Side Access Unit (SAU)

An exemplary SAU 400 is shown in FIG. 4. SAU 400 includes a frame 401 comprising a front plate 402 and a back plate 404, which are coupled together by means of a plurality of fasters 406 and standoffs 408. A pair of through holes 400 are drilled through each of the front and back plates to enable the frame to be coupled to a SAU actuator 228 via bolts 264 (See, e.g., FIG. 2A). The SAU frame is used to hold a plurality of connectors coupled to front plate 402, including a keyboard port connector 412, a mouse port connector 414, a first pair of USB connectors 416, 418, and an IEEE 1394 connector 420. The connectors further include a 9-pin SubD serial port connector 422 and a 25-pin SubD parallel port connector 424. An RCA audio connector 426 is disposed beneath the parallel port connector, along with a fiber optic connector 428. A set of audio jacks 430 are disposed to the left of the parallel port connector, along with provisions for a pair of additional audio jacks 432 to support future five-way audio interfaces. A second pair of USB connectors 436, 438 are disposed toward the left end of the front plate, along with a conventional network RJ-45 connector 440.

Generally, the various connectors and jacks are arranged in a manner corresponding to a standard configuration, such as the ATX standard. It is not required that all of the connector and jacks be used, and in fact different SAUs may be employed for different DUT type configurations.

Each of the various SAU connectors and jacks is connected to a cable that is used to carry signals to corresponding test electronics employed by the tester (not shown in FIG. 4). These include a keyboard cable 442, a mouse port cable 444, an IEEE 1392 cable 446, a serial cable 448, a parallel cable 450, and a network cable 452. Each of these cables include an appropriate mating connector, as would be commonly employed in computer systems and the like. In the illustrated embodiment, wires 454 connected to the various audio jacks are commonly coupled to a connector 456.

In one embodiment, one or more of the connectors/jacks are spring loaded, such as depicted by springs 458 and 460 in the illustrated embodiment. The springs enable different forces to be applied to individual connectors and jacks when the SAU is urged forward to couple corresponding connectors/pins on the DUT, and maintain a constant force on connectors/jacks during the testing operations.

In some instances, only one of the three SAU axes may be employed, such an axis that enabled connectors to be inserted at the back of the DUT via a corresponding SAU. Under such situations, either or both of the side SAU actuators may be removed.

Figure 5:
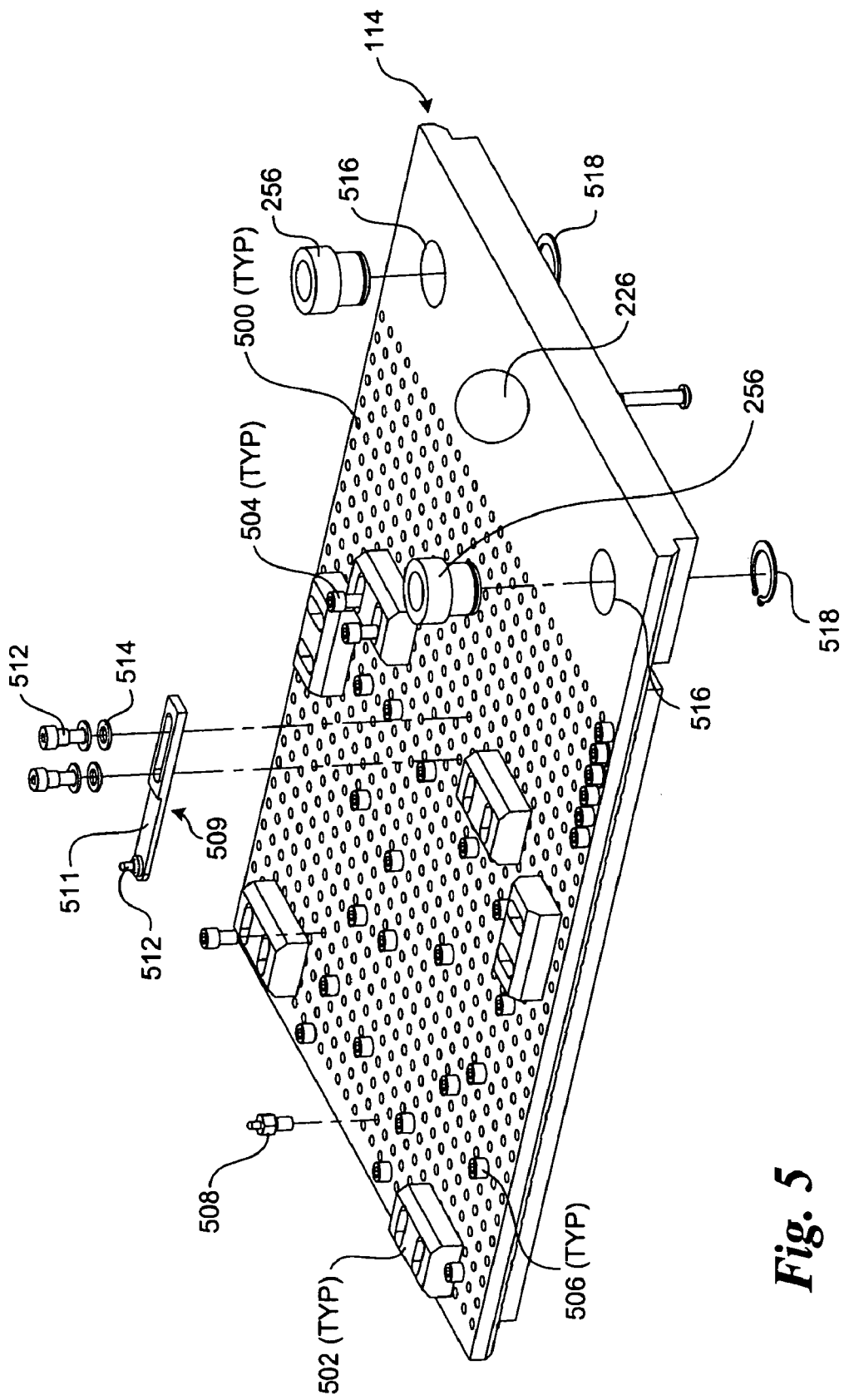
FIG. 5 shows an isometric view of a programmable circuit board carrier plate.
Figure 6A:
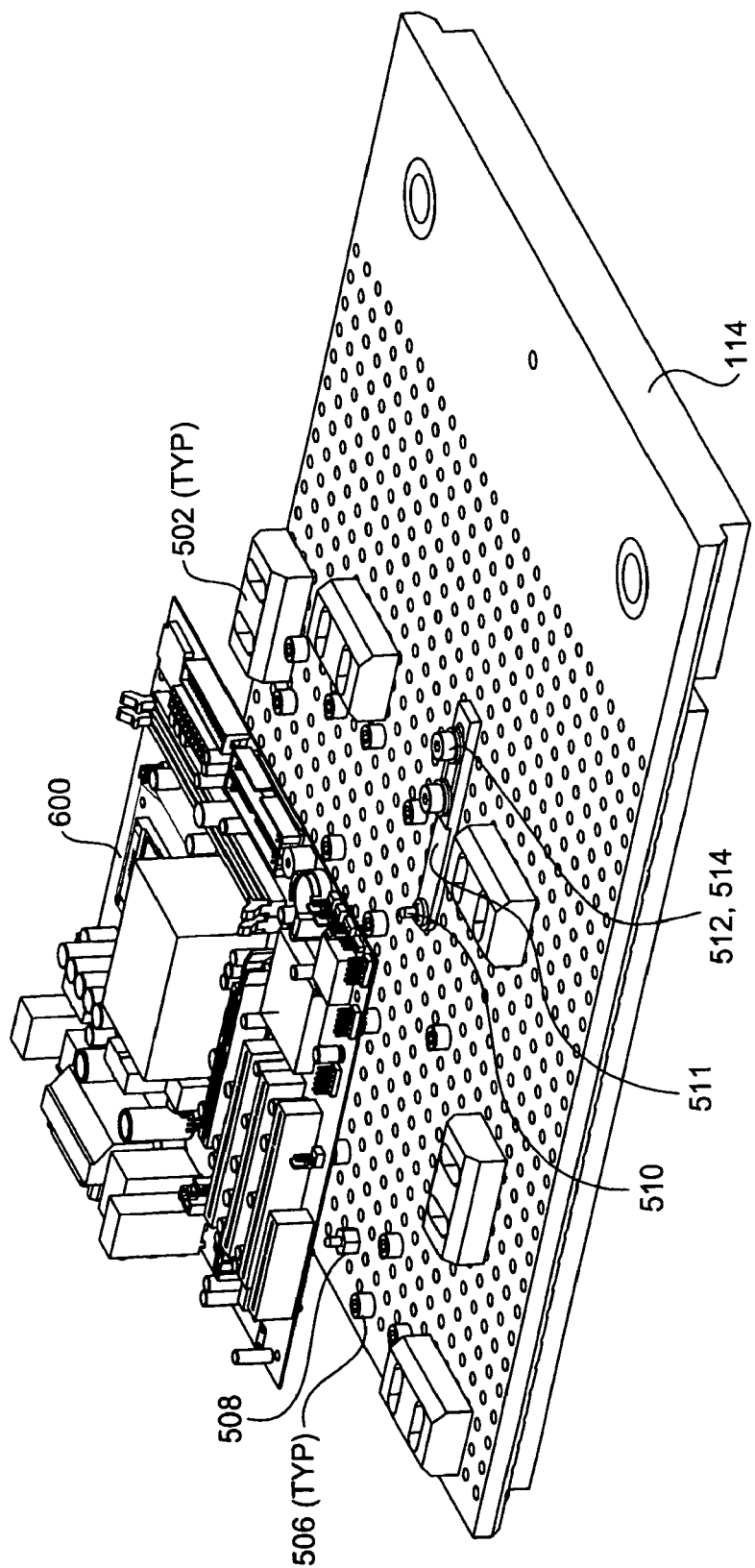
FIGS. 6A and 6B respectively show exploded and assembled isometric views corresponding to a first exemplary configuration of a carrier plate.
Figure 6B:
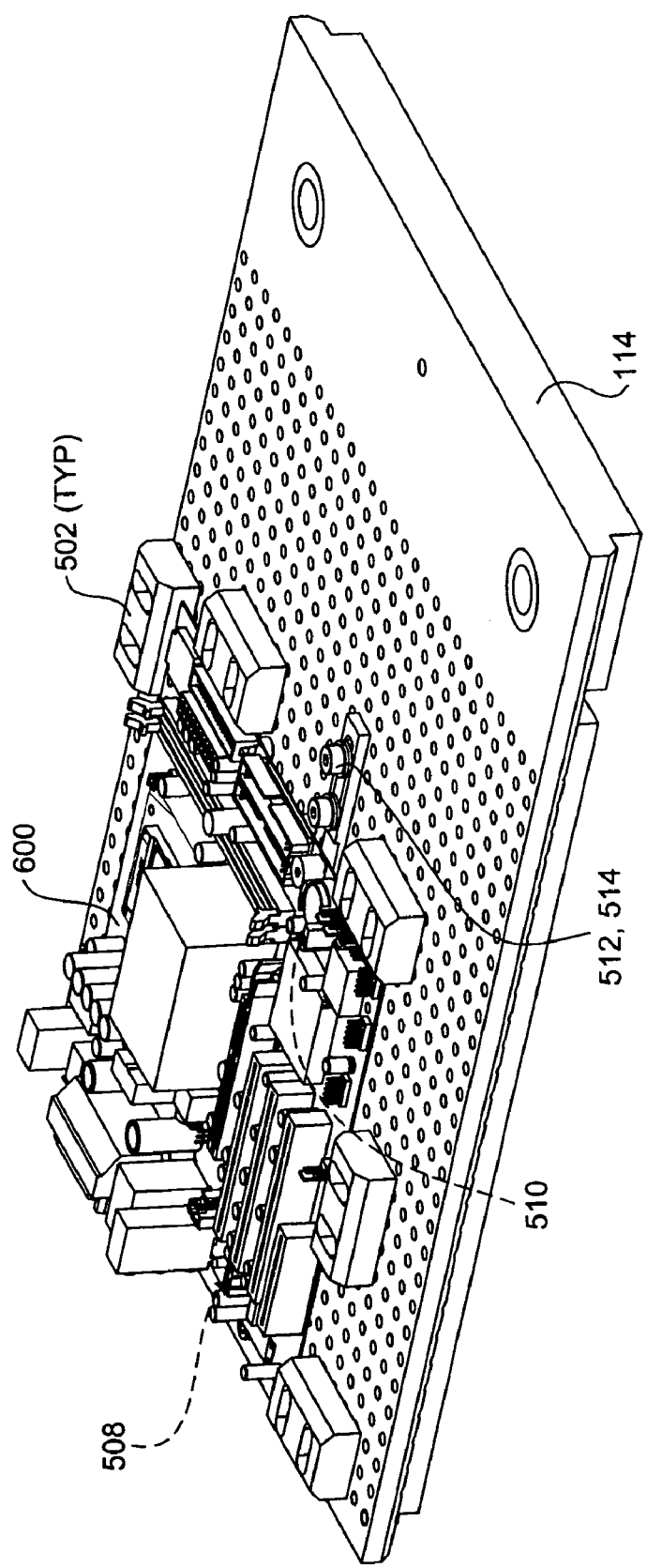
Figure 7A:
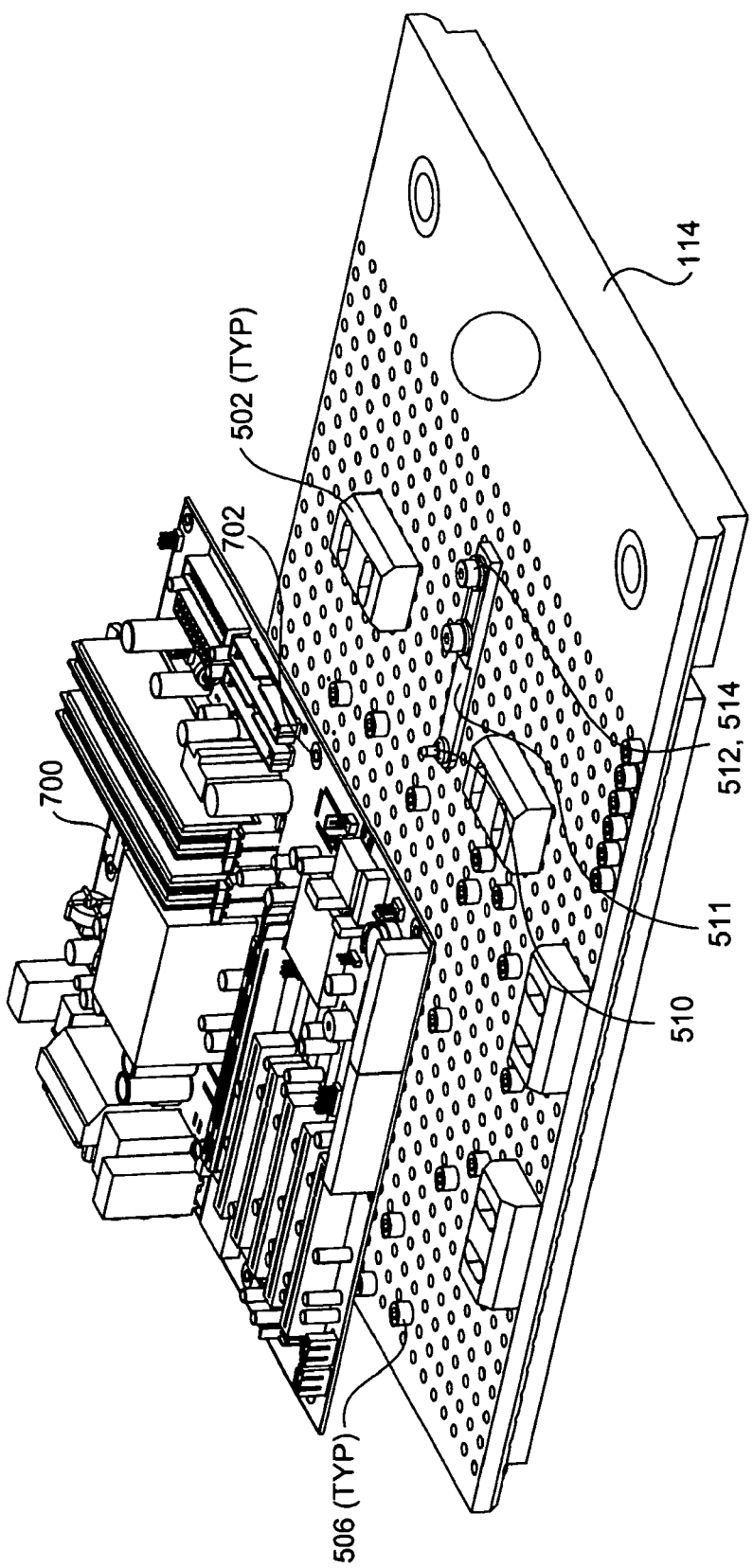
FIGS. 7A and 7B respectively show exploded and assembled isometric views corresponding to a second exemplary configuration of a carrier plate.
Figure 7B:
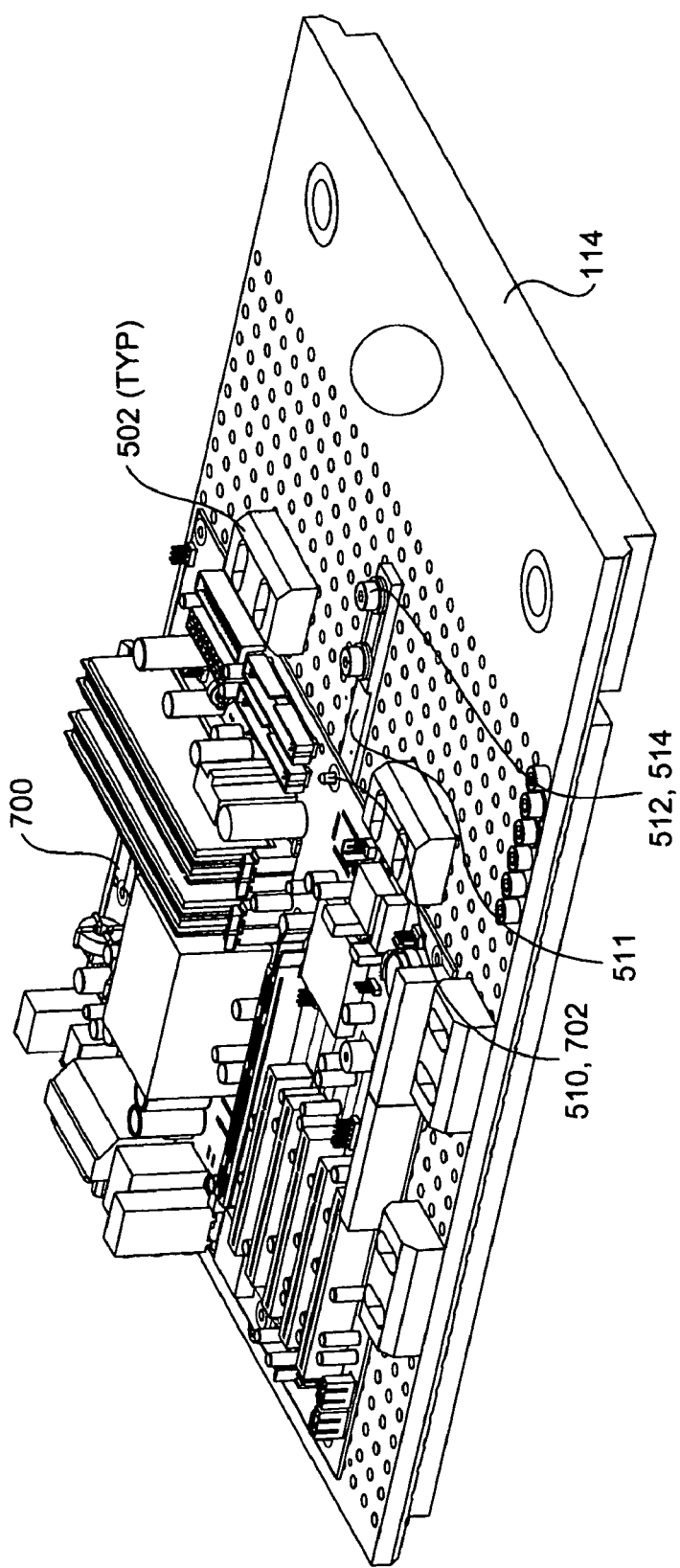

With further reference to FIG. 5, carrier plate 114 provides a universal circuit board mounting platform that may be adapted (programmed) to secure DUTs having a variety of different form factors. The carrier plate includes a grid of threaded holes 500. The threaded holes enable various alignment blocks 502 to be positioned anywhere within the grid area via corresponding threaded fasteners 504. They also enable supports 506 to be located so as to support the DUT at desired locations. In general, the supports will be threaded, although this isn't required. Typically, supports 506 may comprise plastic fasteners to electrically isolate the DUT from the carrier plate. In one embodiment, supports 506 comprise nylon cap screws.

Preferably, threaded holes 500 will be arranged in an accurate grid. In one embodiment ¼-20 threaded holes are arrayed in a 0.500 inch grid pattern. This enables accurate alignment of DUTs to the carrier plate (and thus indirectly to top probe/connector plate 120). In some implementations, sufficient alignment may be facilitated by alignment blocks 502 alone. In other instances, alignment may be facilitated by using more accurate alignment means, such as alignment pins. In instances in which alignment holes formed in the DUT's circuit board (or in components attached thereto) have a spacing that coincides with a multiple of the grid pattern spacing, a pair of "fixed" tooling pins 508 may be employed to align the DUT relative to the carrier plate. In instances in which the spacings do not coincide, a fixed tooling pin 508 will be used at one end, while an adjustable tooling pin 509 will be used at the other end. In one embodiment, the adjustable tooling pin includes a tooling pin 510 mounted on the end of a slotted bar 511, and is secured to the top of the carrier plate by means of shoulder screws 512 and washers 514

As discussed above, a pair of alignment bushings 256 are disposed within holes 516 formed toward the front corners of carrier plate 114. In one embodiment, the alignment bushings may be secured via a light press fit. In another embodiment, a "C" ring 518 is coupled toward a groove 520 formed in the base of alignment bushing 256, whereby the alignment bushing is secured via engagement with a shoulder 522 on the top side of the carrier plate and the C ring on the bottom side of the carrier plate.

Exemplary carrier plate configurations for mounting respective DUT's 600 and 700 are shown in FIGS. 6A-6B and 7A-7B. Generally, a plurality of alignment blocks 502 will attached to the carrier plate and configured to surround the DUT on three or four sides (it is recommended that two sides be used as a minimum). This will typically provide a gross alignment of the DUT. As the DUT is lowered onto the carrier plate, the upper portion of the tooling pins is received by a corresponding alignment hole formed in the circuit board (as shown by alignment holes 702 in DUT 700) or in a component mounted to the circuit board (not shown). Upon installation, the bottom of the DUT circuit board will be supported by the heads of supports 506.

Figure 8:
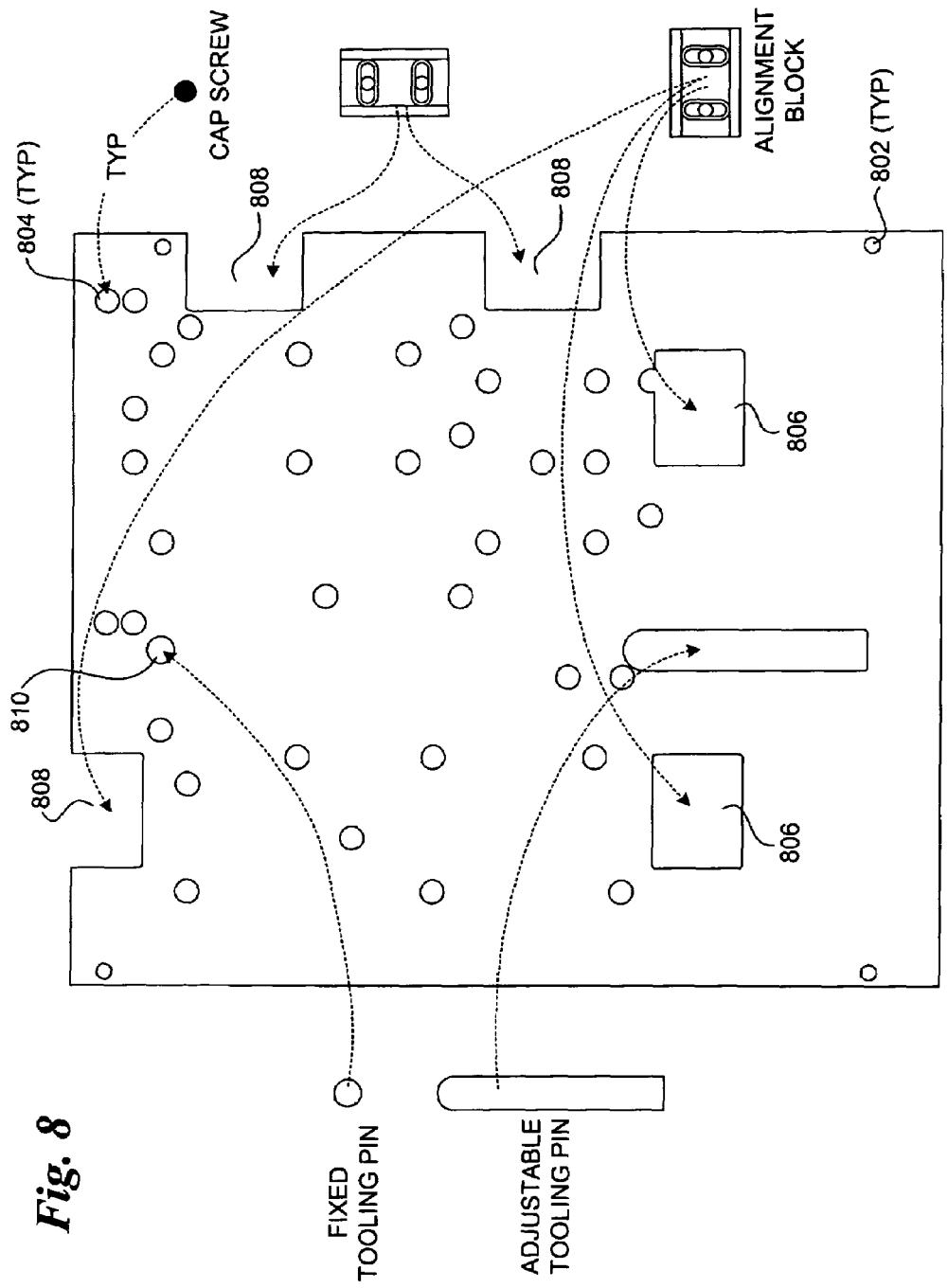
FIG. 8 is a plan view of a template used to assist in programming a carrier plate.

To assist in reprogramming the carrier plate configuration, templates may be employed, such as template 800 shown in FIG. 8. Typically, each template will be made of a thin material such as plastic or metal, and include a means for locating and/or securing the template to the top of the carrier plate. For example, in one embodiment the template may be located and secured via a plurality of alignment holes 802.

Each template will typically include a plurality of holes, slots, and cutouts arranged in a configuration corresponding to a particular form factor for the DUT to which that templates corresponds. These include support holes 804, alignment block cutouts 806 and 808, fixed tooling pin holes 810, and adjustable tooling pin slots 812. If desired, the template may be color coded to further assist test personnel in reprogramming the configuration of the carrier plate (for example, to more easily distinguish between support holes and fixed tooling pin holes).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus comprising:
    a connector plate having a first plurality of connectors coupled thereto arranged in a configuration defined by mating connectors disposed on a circuit board to be tested comprising a device under test (DUT);
    a carrier plate to receive the DUT; and
    a mechanism to urge the carrier plate toward the connector plate to cause respective mating connectors of the connector plate and DUT to be coupled together along at least two different insertion axes via actuation of a single actuator.

2. The apparatus of claim 1, wherein the connector plate further comprises a plurality of probes operatively coupled thereto that are caused to come into contact with circuit elements on the DUT when the carrier plate is urged toward the connector plate.

3. The apparatus of claim 1, further comprising a side access unit having a second plurality of connectors coupled thereto; and
    a mechanism to urge the side access unit toward corresponding connectors coupled to the DUT that are accessible from a side of the DUT.

4. The apparatus of claim 3, wherein the mechanism to urge the side access unit toward the corresponding DUT connectors is configured to allow replacement of side access units having different connector configurations.

5. The apparatus of claim 3, wherein the connector plate further includes a memory holder to receive a memory, said memory being inserted into a corresponding memory connector on the DUT when the carrier plate is urged toward the connector plate.

6. The apparatus of claim 3, further comprising a position detector that provides an output signal indicating that the carrier plate has moved to a position in which said first plurality of connectors are engaged with corresponding connectors on the DUT.

7. The apparatus of claim 3, wherein the connector plate further includes a microprocessor holder to receive a microprocessor, said microprocessor being inserted into a corresponding microprocessor connector on the DUT when the carrier plate is urged toward the connector plate.

8. The apparatus of claim 3, wherein the connector plate includes a peripheral card extender that is operatively coupled to an expansion bus slot on the DUT when the carrier plate is urged toward the connector plate, said peripheral card extender enabling a peripheral card to be tested with the DUT.

9. The apparatus of claim 3, wherein the mechanism to urge the carrier plate toward the connector plate comprises:
    a frame, including a top shelf to which the connector plate is coupled;
    a lift mechanism, including a carrier frame via which the carrier plate is operatively supported; and
    an actuator, coupled to the lift mechanism, to cause the carrier frame assembly to be lifted toward the connector plate upon being actuated.

10. The apparatus of claim 3, wherein the lift mechanism further comprises:
    a carriage, to which one end of the linear actuator is coupled, enabled to slide linearly relative to the frame and including a plurality of ramps;
    a plurality of cam followers, operatively coupled to a carrier frame, to ride up respective ramps on the carriage when the linear actuator is actuated, causing the carrier frame to be lifted upwards.

11. The apparatus of claim 10, wherein the connector plate further includes a pair of alignment pins extended downward therefrom, and the carrier plate includes mating alignment bushings disposed therein, said alignment bushings receiving ends of the respective alignment pins as the carrier plate is urged upward by the carrier frame to cause the carrier plate to be aligned relative to the connector plate prior to coupling the connectors of the DUT with the first plurality of connectors.

12. The apparatus of claim 10, wherein the carrier frame is part of a carrier frame assembly further including:
    a carrier plate support on which the carrier plate rests; and
    a drawer slide, operatively coupled between the carrier frame and the carrier plate support to enable the carrier plate to be extended outward from the carrier frame.

13. An apparatus comprising:
    a connector plate having a first plurality of connectors coupled thereto arranged in a configuration defined by mating connectors disposed on a circuit board to be tested comprising a device under test (DUT);

a carrier plate to receive the DUT;

a mechanism to urge the carrier plate toward the connector plate to cause respective mating connectors of the connector plate and DUT to be coupled together;

a side access unit having a second plurality of connectors coupled thereto; and a mechanism to urge the side access unit toward corresponding connectors coupled to the DUT that are accessible from a side of the DUT, wherein the mechanism to urge the carrier plate toward the connector plate comprises:

a frame, including a top shelf to which the connector plate is coupled;

a lift mechanism, including a carrier frame via which the carrier plate is operatively supported; and an actuator, coupled to the lift mechanism, to cause the carrier frame assembly to be lifted toward the connector plate upon being actuated.

14. An apparatus comprising:

a connector plate having a first plurality of connectors coupled thereto arranged in a configuration defined by mating connectors disposed on a circuit board to be tested comprising a device under test (DUT);

a carrier plate to receive the DUT; and a mechanism to urge the carrier plate toward the connector plate to cause respective mating connectors of the connector plate and DUT to be coupled together;

a side access unit having a second plurality of connectors coupled thereto; and a mechanism to urge the side access unit toward corresponding connectors coupled to the DUT that are accessible from a side of the DUT, the mechanism comprising:

a carriage, to which one end of the linear actuator is coupled, enabled to slide linearly relative to the frame and including a plurality of ramps;

a plurality of cam followers, operatively coupled to a carrier frame, to ride up respective ramps on the carriage when the linear actuator is actuated, causing the carrier frame to be lifted upwards.

15. The apparatus of claim 14, wherein the connector plate further includes a pair of alignment pins extended downward therefrom, and the carrier plate includes mating alignment bushings disposed therein, said alignment bushings receiving ends of the respective alignment pins as the carrier plate is urged upward by the carrier frame to cause the carrier plate to be aligned relative to the connector plate prior to coupling the connectors of the DUT with the first plurality of connectors.

16. The apparatus of claim 14, wherein the carrier frame is part of a carrier frame assembly further including:

a carrier plate support on which the carrier plate rests; and a drawer slide, operatively coupled between the carrier frame and the carrier plate support to enable the carrier plate to be extended outward from the carrier frame.

* * * * *